United States Patent
Minami et al.

(10) Patent No.: US 6,884,294 B2
(45) Date of Patent: Apr. 26, 2005

(54) COATING FILM FORMING METHOD AND APPARATUS

(75) Inventors: Tomohide Minami, Koshi-Machi (JP); Shinichi Sugimoto, Kikuyo-Machi (JP); Takahiro Kitano, Koshi-Machi (JP); Jun Ookura, Koshi-Machi (JP); Hiroaki Kurishima, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 238 days.

(21) Appl. No.: 10/122,390

(22) Filed: Apr. 16, 2002

(65) Prior Publication Data

US 2002/0150679 A1 Oct. 17, 2002

(30) Foreign Application Priority Data

Apr. 16, 2001 (JP) ........................................ 2001-117191
Apr. 25, 2001 (JP) ........................................ 2001-127823

(51) Int. Cl.⁷ ............................................... B05C 5/00
(52) U.S. Cl. ..................... 118/668; 118/52; 118/301; 118/320; 118/321; 118/323; 118/504; 427/240; 427/425; 438/758; 438/782
(58) Field of Search ............................ 118/52, 320, 321, 118/301, 323, 504, 671, 668; 427/240, 425, 282; 438/758, 782

(56) References Cited

U.S. PATENT DOCUMENTS

| | | | | |
|---|---|---|---|---|
| 5,532,192 A | * | 7/1996 | Adams ........................ | 438/782 |
| 5,902,399 A | * | 5/1999 | Courtenay .................... | 118/52 |
| 5,928,425 A | * | 7/1999 | Lee .............................. | 118/712 |
| 6,191,053 B1 | * | 2/2001 | Chun et al. .................. | 438/780 |
| 6,371,667 B1 | * | 4/2002 | Kitano et al. ................ | 396/611 |
| 6,383,948 B1 | * | 5/2002 | Kitano et al. ................ | 438/758 |
| 6,407,009 B1 | * | 6/2002 | You et al. .................... | 438/782 |
| 6,416,583 B1 | * | 7/2002 | Kitano et al. ................ | 118/680 |
| 2001/0039117 A1 | * | 11/2001 | Ito et al. ...................... | 438/689 |

* cited by examiner

*Primary Examiner*—Kirsten Jolley
(74) *Attorney, Agent, or Firm*—Oblon, Spivak, McClelland, Maier & Neustadt, P.C.

(57) ABSTRACT

A coating solution is sprayed on a rotating wafer held horizontally from a nozzle provided above the wafer while the nozzle is travelling over the wafer from a wafer center to a wafer outer area, thus spirally spraying the coating solution on the wafer. The nozzle stops when the coating solution has reached the wafer outer area and the coating solution is sprayed in circle on the wafer outer area while the wafer is rotating. A coating solution including a component of a coating film and a solvent may be sprayed on a first area to be coated of the wafer and the coating solution and a solvent for the coating film may be sprayed on a second edge area located outside the first area of the wafer.

9 Claims, 14 Drawing Sheets

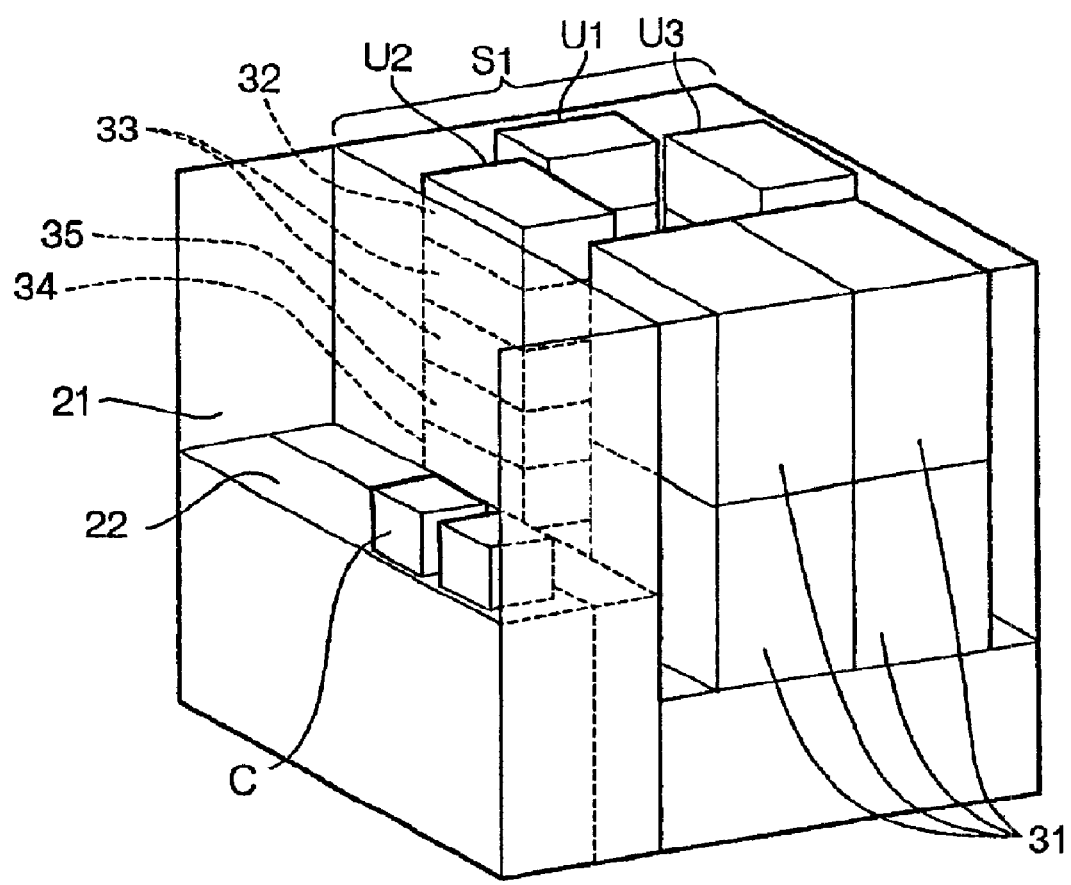
F I G. 5

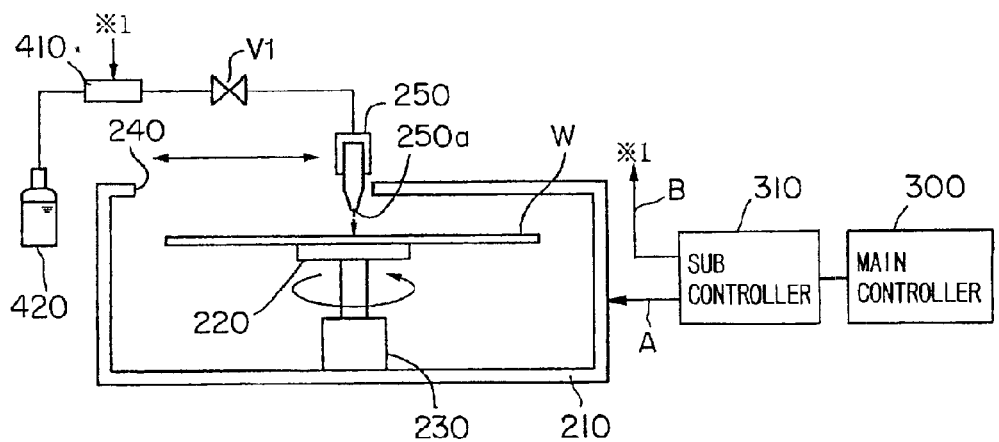
F I G. 6
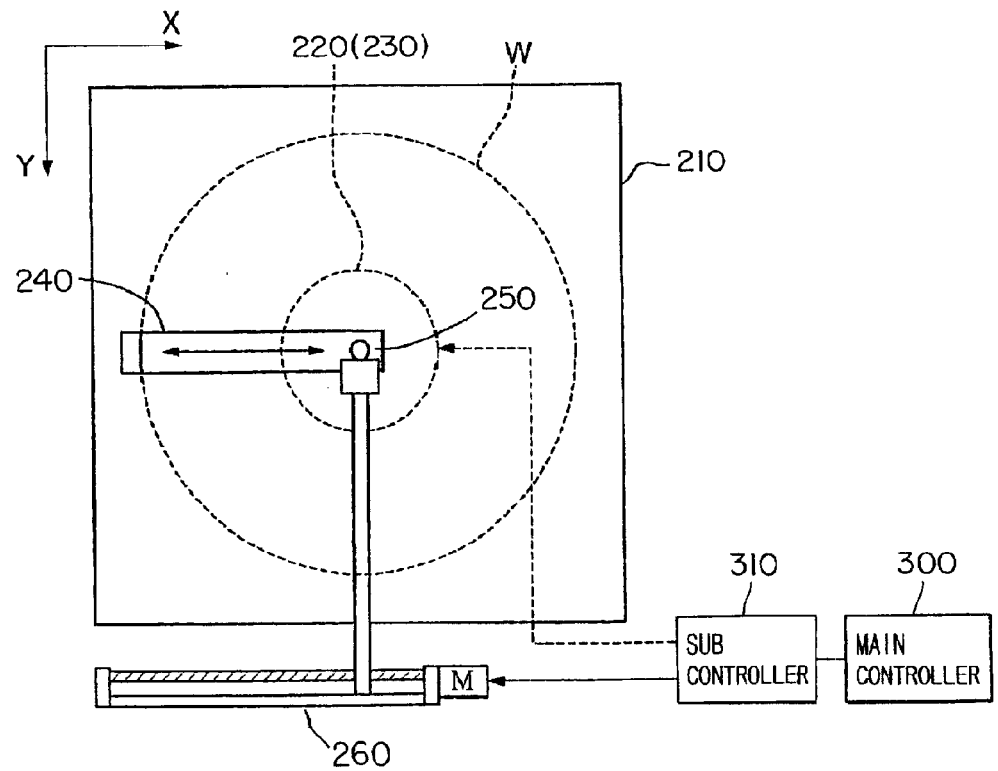
F I G. 7

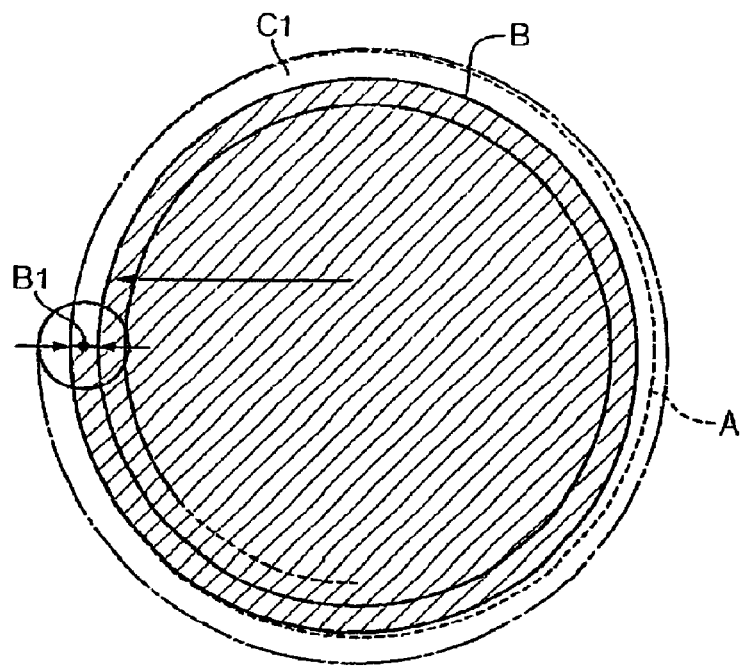
F I G. 10 A
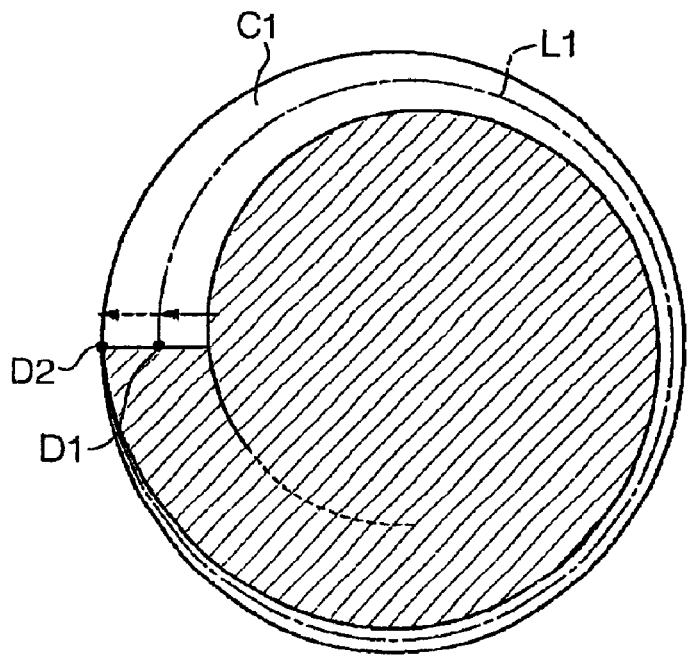
F I G. 10 B

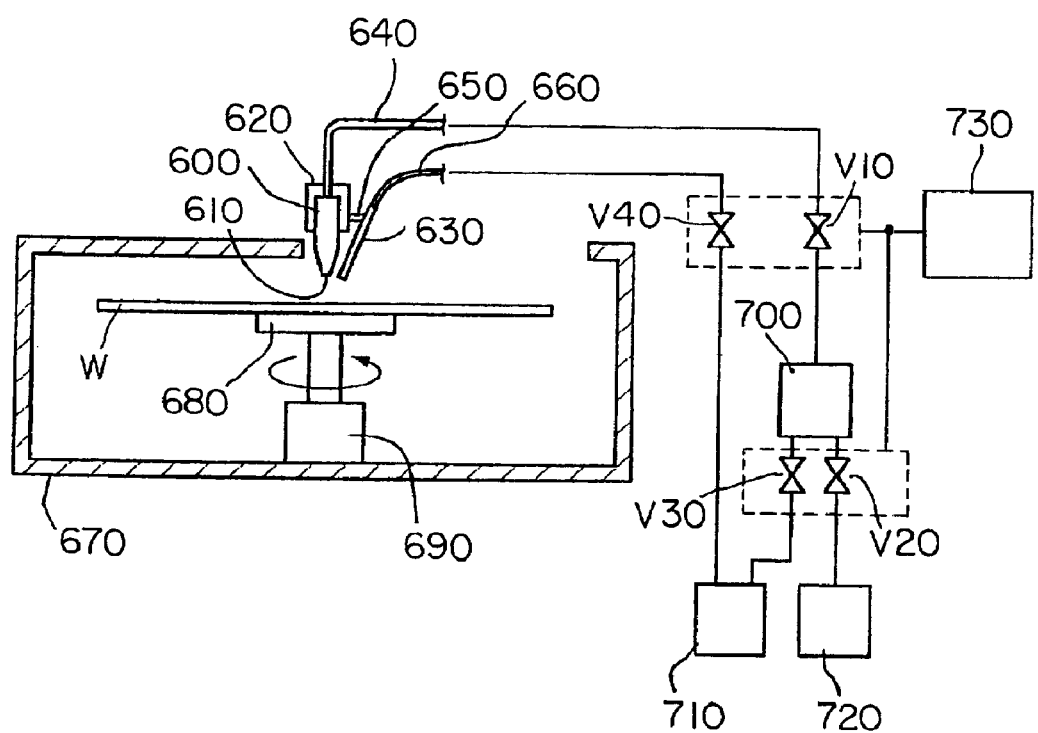
F I G. 13

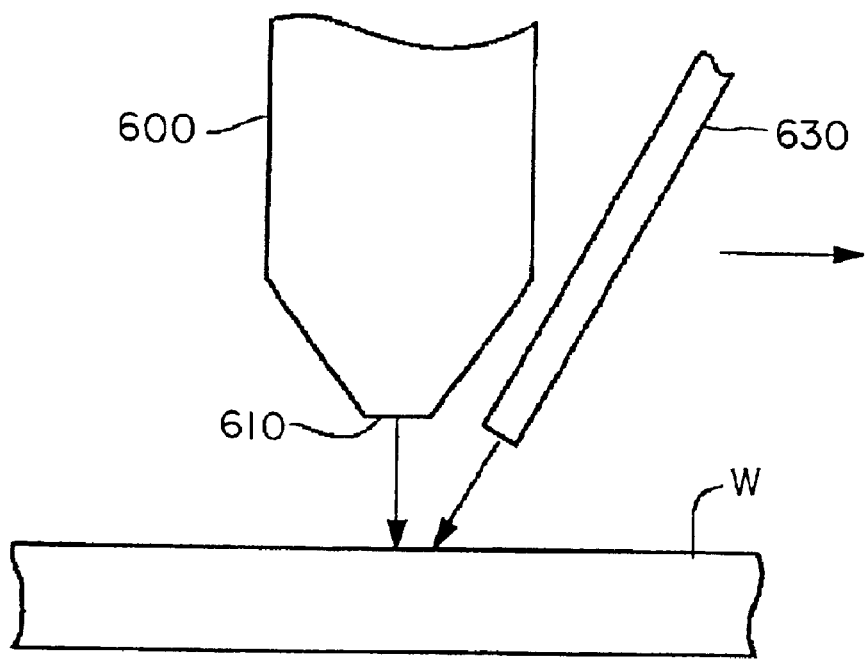
F I G. 15
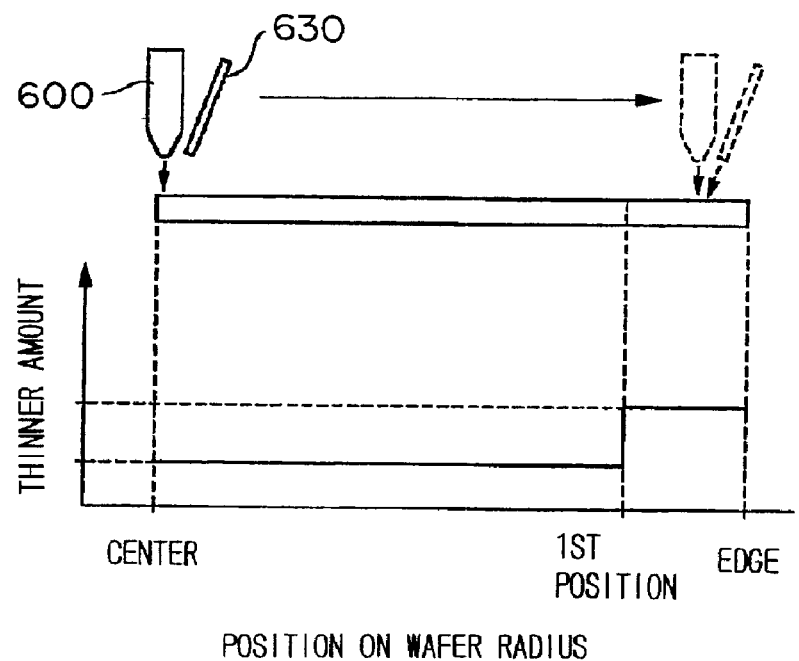
F I G. 16

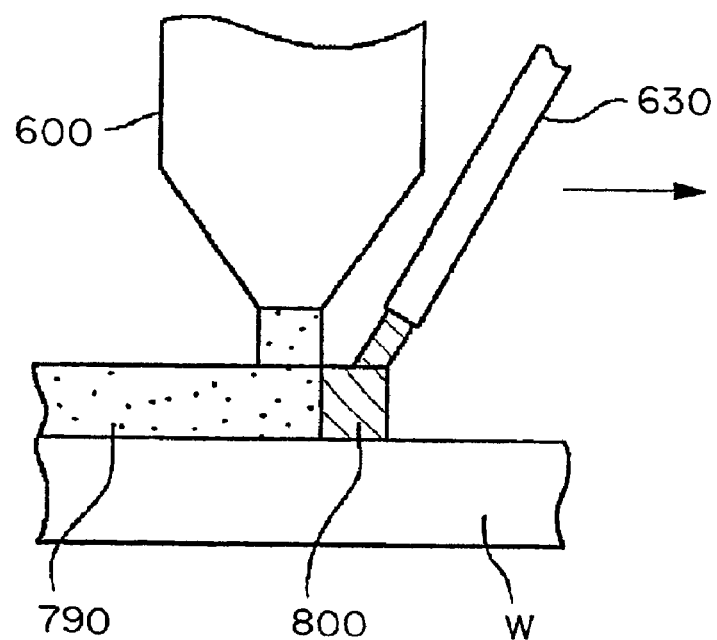
F I G. 18
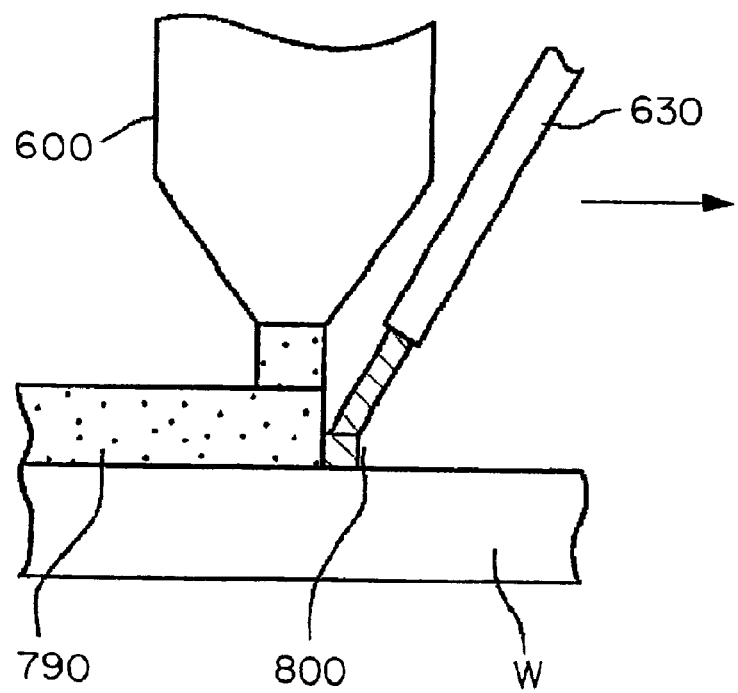
F I G. 19

COATING FILM FORMING METHOD AND APPARATUS

BACKGROUND OF THE INVENTION

The present invention relates to a method and an apparatus for forming a coating film on a substrate such as a semiconductor wafer and a LCD substrate (a glass plate for liquid-crystal displays) by applying a coating solution to be used for device-protective films, etc.

A procedure of applying polyimide as a coating solution on a substrate such as a semiconductor wafer for forming a protective film or inter-layer insulating film is one of several procedures of fabricating semiconductor devices.

A known method for the coating procedure is as follows: A coating solution is prepared which is made of polyimide dissolved in a solvent. The coating solution is further diluted with another solvent.

The coating solution is then sprayed on a wafer W, as illustrated in FIG. 1. In detail, a coating nozzle 11 travels over the wafer W little by little and almost horizontally in the radius direction while the wafer W is rotating. The coating solution is spirally splayed on the rotating wafer W from the nozzle 11 with a single stroke. The wafer W is then heated to evaporate the solvent and cooled to form a coating film thereon.

The known method includes two techniques: (1) The coating solution is sprayed on the wafer W at a constant supplying rate so that lines of the coating solution sprayed as adjacent on the wafer W will be arranged tight or with a uniform gap therebetween, for forming a coating film with a high uniformity in thickness over the wafer. (2) The nozzle 11 is controlled with a constant spraying amount for the coating solution so that it will travel at a high speed over the center of the wafer but at gradually slower speeds towards the edge, for forming a coating film with a high uniformity in thickness over the wafer surface.

The technique (1), however, has the following drawbacks: A coating film formed by this technique will exhibit a high uniformity in thickness over the wafer surface, but will not be round perfectly when viewed from above, thus stress being applied irregularly over the entire film surface.

For example, it is assumed that the nozzle 11 stops when the outer edge of a line of coating solution touches an area to be coated P indicated by a dot-line circle in FIG. 2.

This results in that the outermost line of coating solution Q1 will not become a perfect circle because it is drawn spirally, thus a bump of the coating film, or a significant section (area) will be formed at an edge Q2, with a small outer area R which will not be coated.

The supply of coating solution from the nozzle 11 may not necessarily be brought to a halt immediately by a user operation. The nozzle 11 mostly has a small diameter such as 100 m in actual use, so that a coating solution passing through the nozzle could easily suffer a residual pressure in the nozzle. This could result in that an excess coating solution drips from the nozzle and over-supplied to the wafer surface after the supply of coating solution is brought to a halt. Such an excess coating solution could be over-supplied to the edge Q2 (FIG. 2) so that the coating film will be formed at this area thicker than the other areas on the wafer W, as the bump, or the significant section (area).

Generation of such a significant section on a coating film could cause irregularity in stress over the coating-film surface in subsequent procedures such as drying under reduced pressure, cooling and heating. This results in variation in degree of treatment on the coating-film surface by these procedures. For example, the evaporation of solvent will not be constant over the coating-film surface in the drying procedure under reduced pressure, thus causing irregularity in coating-film thickness.

The irregularity in film thickness could further pose problems on developing and etching, the subsequent procedures. For instance, a photosensitive polyimide could change developing performance and thus form no holes on the semiconductor wafer whereas a non-photosensitive polyimide could cause variation in etching-proof performance over the coating-film surface thus cause un-etched parts on thick film areas.

The technique (2) also has the following drawbacks:

As shown in FIG. 3, a coating solution 12 including polyimid was sprayed on a 8-inch wafer W to form an about 10 $\mu$m-thick coating film while the speed of the nozzle 11 is varying. It was observed that bumps were formed at the outermost edges of the wafer, about 0.5 $\mu$m thicker than the other areas, after heating and drying.

Such thick parts at the outermost edges could also affect developing and etching performance and thus form no holes, or un-etched areas remain on the wafer.

The following is a possible explanation of these problems.

The solvent in the coating solution 12 is evaporated from the entire film surface and also the side edges of the outer areas of the wafer W. The degree of evaporation at the outer areas of the wafer W is higher than the other areas, thus an evaporating rate of the solvent is also higher at the outer areas than the other areas. The evaporation of solvent from an area at a high evaporating rate causes decrease in temperature and thus increase in surface tension on this area. The increased surface tension pulls the coating solution towards the outer areas, which results in a thick polyimide film formed on the outer areas due to a high solidification rate of polyimide.

In FIG. 3, as discussed above, a high evaporating rate of the solvent on the outer areas could have caused high solidification to polyimide and thus a thick film was formed on the outer areas.

SUMMARY OF THE INVENTION

A purpose of the present invention is to provide a method and an apparatus for forming a coating film on a substrate by spirally spraying a coating solution on the substrate surface to achieve uniformity of film thickness over the entire substrate surface.

The present invention provides a method of forming a coating film including the steps of: a first coating step of spraying a coating solution on a wafer from a nozzle provided above the wafer while rotating the wafer held horizontally and moving the nozzle over the wafer from a wafer center to a wafer outer area, thus spirally spraying the coating solution on the wafer; and a second coating step of stopping the nozzle when the coating solution has reached the wafer outer area and spraying the coating solution in circle on the wafer outer area while the rotating the wafer.

Moreover, the present invention provides a method of forming a coating film including the steps of: a first coating step of spraying a coating solution on a wafer from a nozzle provided above the wafer while rotating the wafer held horizontally and moving the nozzle over the wafer from a wafer center to a wafer outer area, thus spirally spraying the coating solution on the wafer; and a second coating step of gradually decreasing an amount of the coating solution to be sprayed and/or gradually increasing a peripheral velocity of the wafer just under the nozzle while the nozzle is travelling, when the coating solution has reached the wafer outer area, thus the coating solution gradually becoming a circle on the wafer outer area.

Furthermore, the present invention provides a method of forming a coating film including the steps of: a coating step of spraying a coating solution on a wafer from a nozzle provided above the wafer while rotating the wafer held horizontally and moving the nozzle over the wafer from a wafer center to a wafer outer area, thus spirally spraying the coating solution on the wafer; and a shutting-out step of positioning a solution receiver between the nozzle and the wafer when the coating solution has reached a final coating point on the wafer, thus shutting out an excess flow of the coating solution on the solution receiver.

Moreover, the present invention provides a coating-film forming apparatus including: a rotary mechanism to rotate a wafer while holding a wafer horizontally; a nozzle provided above the wafer, to travel over the wafer from a wafer center to a wafer outer area, thus spirally spraying a coating solution on the wafer; and a controller to control the nozzle to stop when the coating solution has reached the wafer outer area and spray the coating solution in circle on the wafer outer area while the wafer is rotating.

Furthermore, the present invention provides a method of forming a coating film on a wafer held almost horizontally by a wafer holder, by spirally spraying a coating solution including a component of the coating film and a solvent on the wafer from a nozzle provided as facing the wafer surface and evaporating the solvent, thus forming the coating film on the wafer, including the steps of: spraying the coating solution including the component of the coating film and the solvent on a first area of the wafer; and spraying the coating solution and a solvent for the coating film on a second edge area located outside the first area of the wafer.

Furthermore, the present invention provides a coating-film forming apparatus including: a wafer holder to hold a wafer held almost horizontally; a coating nozzle provided as facing the wafer surface to spray a coating solution including a component of a coating film and a solvent on the wafer; a fog nozzle to spray a solvent for the coating film on an edge area located outside an area to be coated on the wafer; and a controller to control the coating nozzle and the fog nozzle to spirally spray the coating solution on the area to be coated from the coating nozzle, and then spirally spray the coating solution on the edge area from the coating nozzle and spray the solvent for the coating film on the edge area from the fog nozzle.

BRIEF DESCRIPTION OF DRAWINGS

FIG. 5 is a perspective view showing the processing system;

FIG. 6 is a vertical longitudinal sectional view of the coating-film forming apparatus according to the present invention incorporated into each coating unit;

FIG. 7 is a plan view showing the coating-film forming apparatus according to the present invention;

FIG. 10A illustrates formation of a coating film on a wafer in a second coating procedure in a second embodiment according to the present invention;

FIG. 10B also illustrates formation of a coating film on a wafer in the second coating procedure in the second embodiment according to the present invention;

FIG. 13 is a vertical longitudinal sectional view of a fourth embodiment of the coating-film forming apparatus according to the present invention;

FIG. 15 is a side view illustrating a coating nozzle and a fog nozzle used in the fourth embodiment according to the present invention;

FIG. 16 is a graph explaining an operation of the fourth embodiment according to the present invention;

FIG. 18 is another side view illustrating the coating nozzle and the fog nozzle used in the fourth embodiment according to the present invention;

FIG. 19 is a still another side view illustrating the coating nozzle and the fog nozzle used in the fourth embodiment according to the present invention;

DETAILED DESCRIPTION OF PREFERRED EMBODIMENTS

Preferred embodiments according to the present invention will be disclosed with reference to the attached drawings.

Figure 1:
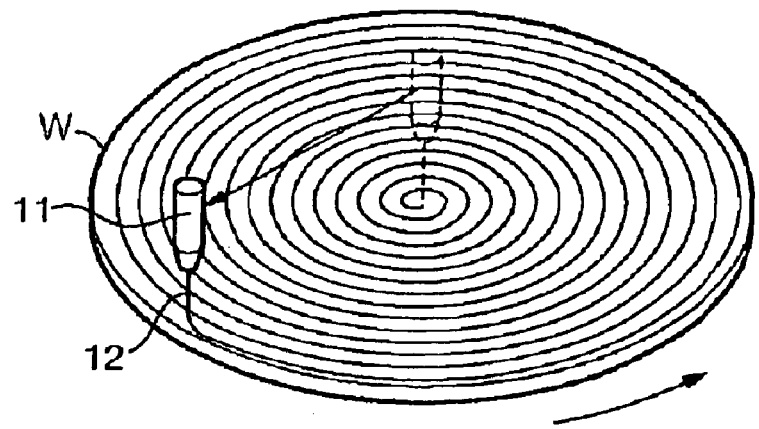
FIG. 1 illustrates a method of spirally spraying a coating solution on a wafer.
Figure 2:
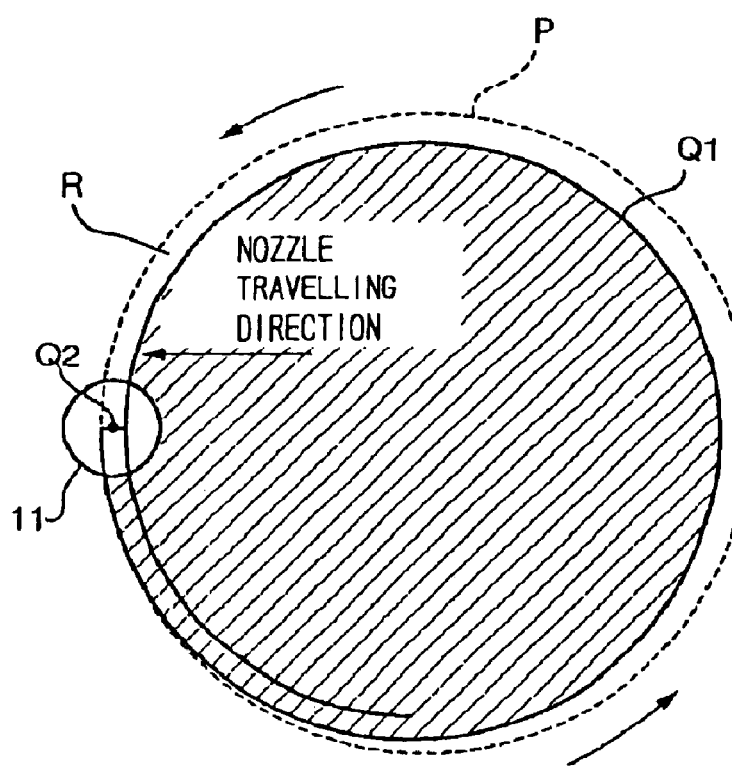
FIG. 2 illustrates problems posed by a known coating method.
Figure 3:
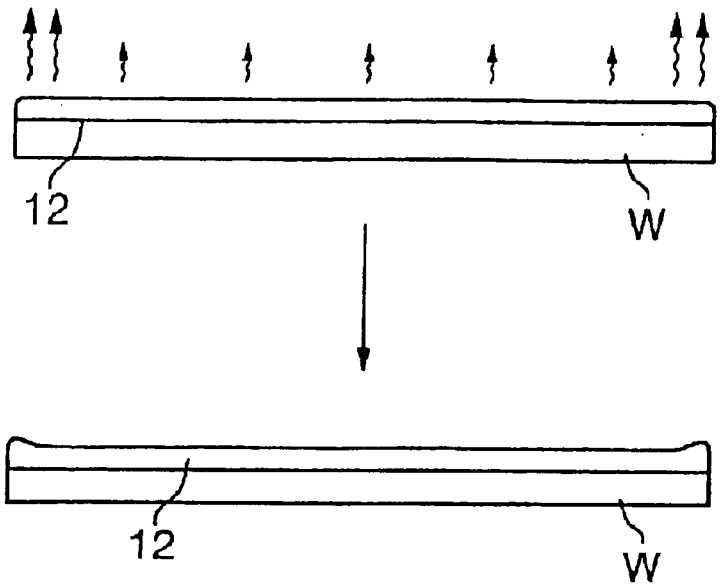
FIG. 3 illustrates a known method of coating a film on a wafer.
Figure 4:
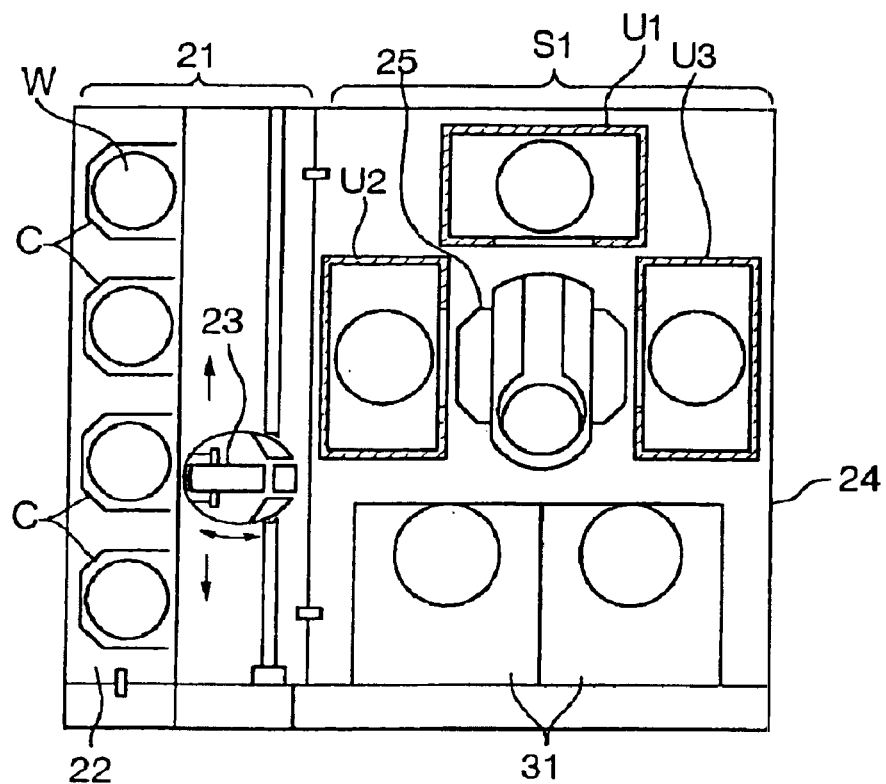
FIG. 4 is a plan view showing a processing system into which a coating-film forming apparatus according to the present invention is incorporated.

Disclosed first with reference to FIGS. 4 and 5 is a processing system into which a coating-film forming apparatus according to the invention is incorporated.

A cassette station 21 includes a cassette table 22 and a transfer arm 23. Provided on the cassette table 22 are several cassettes C each containing, for example, 25 wafers W. The transfer arm 23 picks up the wafers W from the cassettes C and transfers them into a processing section S1 and then brings them back to the cassettes C after several procedures.

The processing section S1 is installed in a frame 24 behind the transfer arm 23 when viewed from the cassette station 21. Provided in the center of the processing section S1 is a main transfer mechanism 25 which is surrounded by several units. In detail, several coating units 31 are set at the right side of the main transfer mechanism 25 when viewed from the cassette station 21. Shelf units U1, U2 and U3 of heating and cooling units stuck each other are set at the left side of, in front of and behind the main transfer mechanism 25 when viewed from the cassette station 21.

The shelf units U1, U2 and U3 consist of several units for performing several procedures before and after the procedure at the coating units 31. In detail, as shown in FIG. 5, each shelf unit consists of a drying unit 32 for drying wafers W under reduced pressure to evaporate a solvent involved in a coating solution applied on the wafer surface by the coating unit 31; a heating unit 33 for heating (baking) the wafers W; and a cooling unit 34 for cooling the wafers W. In addition to these units, the shelf units U2 and U3 include a transfer unit 35 with a table for receiving and transferring the wafers W. Other types of unit may also be incorporated into these shelf units according to need.

The main transfer mechanism 25 can move up, down, forward and backward and rotate about its vertical axis to receive the wafers W from and transfer them to the coating units 31 and the shelf units U1, U2 and U3.

Disclosed next are several embodiments of coating-film forming apparatus incorporated into the processing system explained above, for forming a polyimide-protective film in fabrication of semiconductor devices.

(First Embodiment)

FIG. 6 is a vertical longitudinal sectional view of a coating-film forming apparatus incorporated into each coating unit 31 (FIG. 5). FIG. 7 is a plan view showing the coating-film forming apparatus.

A case 210 is a hollow housing with an opening (not shown) at either side for receiving and transferring wafers W (substrates). Installed in the case 210 are a wafer holder 220 for holding each wafer W by sucking its rear surface and a rotary mechanism 230 for sustaining the wafer holder 220 and rotating it about the vertical axis during a coating procedure. A slit 240 is formed at a ceiling edge of the case 210, which extends in the X-direction.

Provided over the case 210 is a coating nozzle 250 for splaying a polyimide solution (a coating solution) on the wafer W. The nozzle 250 is set so that its spray opening 250a will be inserted into the case 210 through the silt 240. The nozzle 250 is transferred in the X-direction by a drive mechanism 260 provided outside the case 210, for spraying a coating solution through the spray opening 250a, a very narrow opening of about 100 $\mu$m diameter.

The rotary mechanism 230 and the drive mechanism 260 are controlled by a control signal sent from a main controller via a sub controller 310.

Disclosed next with reference to FIG. 6 is a coating-solution supplying mechanism.

A coating-solution source 420 is connected to the nozzle 250 via a pump 410 and a valve V1. Contained in the source 420 is a solution of polyimide for coating films resolved in a solvent such as NMP (N-methylpyrrolidone).

The pump 410 is connected to the main controller 300 via the sub controller 310. The main controller 300 controls the pump 410 to adjust a supplying rate of the polyimide solution to be sprayed on the wafer W through the nozzle 250.

The pump 410 is a bellows pump, for example. The bellows expands and contracts to switch the solution suction and spraying timing. The expansion and contraction of the pump can be controlled by a stepping motor which is driven by the main controller 300, for adjusting a polyimide-solution spraying rate. The spraying-rate adjuster attached to the pump 410 such as the bellows and the stepping motor are not shown for brevity.

Operation of the first embodiment of coating film-forming apparatus is disclosed.

A wafer W is transferred into the case 210 by the main transfer mechanism 25 (FIG. 4) and held almost horizontally while its rear surface is being sucked by the wafer holder 220.

Figure 8A:
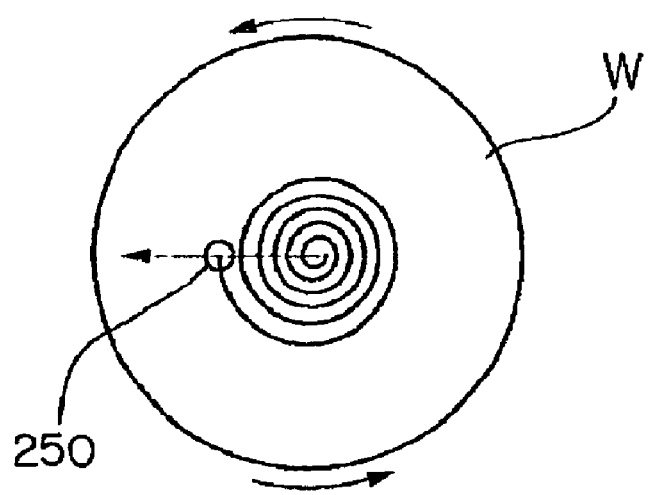
FIG. 8A illustrates formation of a coating film on a wafer in a first coating procedure performed by the coating-film forming apparatus according to the present invention.

The wafer W is rotated by the rotary mechanism 230. The nozzle 250 is positioned over the center of the rotating wafer W. The polyimide-solution is sprayed while the nozzle 250 is gradually travelling straight over the wafer W from the center to the outer areas. The solution is thus spirally sprayed on the wafer W, as illustrated in FIG. 8A (a first coating procedure).

The main controller 300 controls movement of the nozzle 250 and rotation of the wafer W as follows:

Several patterns for supplying a coating solution at an appropriate amount per target film thickness has been stored in a memory (not shown) of the main controller 300. An operator selects one of the patterns for a target film thickness, thus the main controller 300 sends control signals to the driving route (A) and the coating-solution supplying route (B) of the coating-film forming apparatus, as indicated by arrows (A) and (B).

Figure 8B:
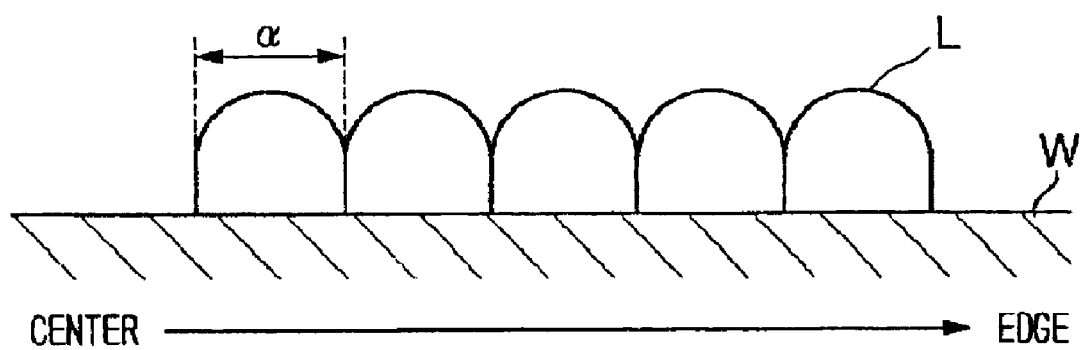
FIG. 8B also illustrates formation of a coating film on a wafer in the first coating procedure performed by the coating-film forming apparatus according to the present invention.

Coating-solution supplying patterns may be set in accordance with the type of coating solution and wafer, and target thickness. Each supplying pattern may be a combination of a travel pattern and a rotation pattern. The travel pattern indicates the relation between positions on the wafer W just under the travelling nozzle 250 a speed of the nozzle 250 over each position. The rotation pattern indicates the relation between positions on the wafer W just under the nozzle 250 and a rotating speed of the wafer W at each position. The coating procedure using such supplying patterns achieves formation of a coating film at a width for each line of coating solution L with no gaps in the direction of diameter of the wafer W, as illustrated in FIG. 8B.

The nozzle 250 stops when the head B1 of the line of coating solution has reached the point of outer edge of a circle area A, a target area to be coated.

Comparison in shape of the outer areas between an area B on which a coating film has been formed as indicated by oblique lines and the circle area A to be coated reveals that bumps, or significant sections (areas), discussed in the known technique (1), are formed on the wafer W near the head B1 of the line of coating solution. The procedure goes to a second coating procedure with such bumps formed on the outer areas of the wafer W.

In this embodiment and subsequent embodiments, the wafer W and the area A to be coated are drawn as a circle and their outer edges overlap each other with no special indications in the figures for brevity.

Figure 9A:
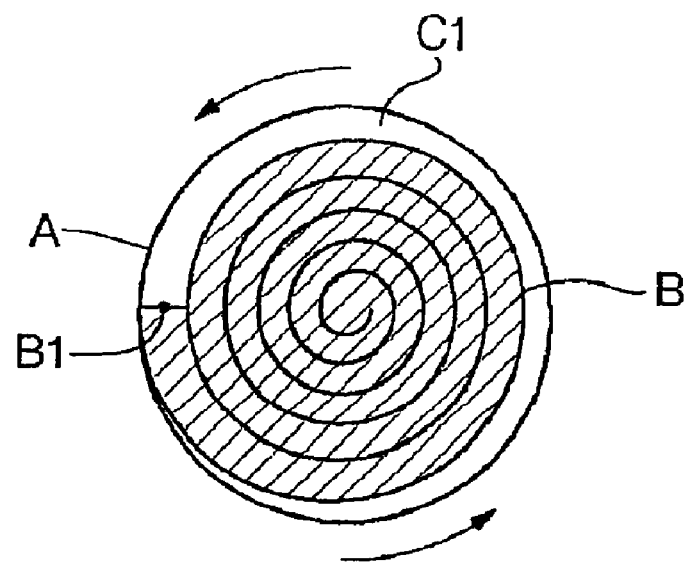
FIG. 9A illustrates formation of a coating film on a wafer in a second coating procedure in a first embodiment according to the present invention.

The line of coating solution is indicated as being wider towards the outer areas in FIG. 9A due to the performance of a figure drawing program, which is actually formed at a constant width, as illustrated in FIG. 8B.

The second coating procedure is to reform the area B on which the coating film has been formed as explained above to become a circle so as to have a close match with the circle area A to be coated.

In detail, the nozzle 250 stops over the area B and sprays the coating solution on the wafer W which is rotated simultaneously. The head B1 of the line of coating solution is sprayed towards its starting point indicated in FIG. 9A, as forming a circular track, not spiral.

Figure 9B:
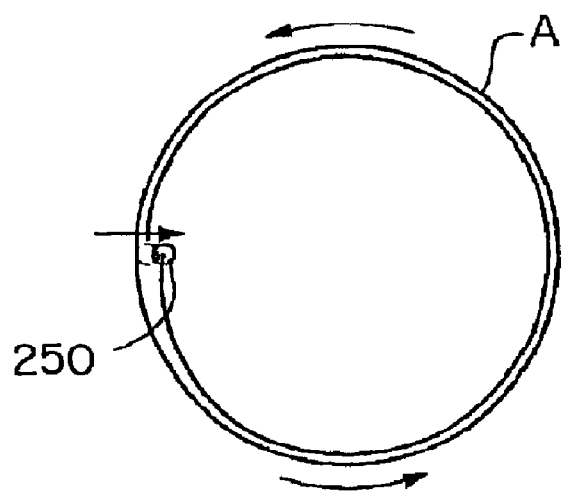
FIG. 9B also illustrates formation of a coating film on a wafer in the second coating procedure in the first embodiment according to the present invention.

The coating solution is then sprayed on an area C1 not coated yet to become an almost perfect circle on the outer areas. The nozzle 250 is shifted towards the center a little bit, for example, in the range from 0.5 mm to 2 mm, as illustrated in FIG. 9B, and stops there to halt the supply of the coating solution, just before that the wafer W will have rotated by 360 degrees.

The first and the second coating procedures have been explained differently. These procedures may, however, be performed sequentially. In detail, on completion of the first coating procedure, the nozzle 250 stops but the supply of the coating solution continues and the wafer W is continuously rotating. FIG. 9A illustrates the head B1 of the line of coating solution, over which the nozzle 250 stops, with an extraordinarily thick line.

As disclosed above, according to this embodiment, the coating solution is sprayed on the wafer W such that the line of coating solution is spirally drawn from the center towards the outer areas but circularly drawn at the last stroke, or on the outermost outer areas.

This supply of coating solution will generate almost no significant sections (areas). Or, it will be smaller even if generated, compared to the known techniques.

Moreover, shifting the nozzle 250 towards the center a little bit in this embodiment prevents a phenomenon which may otherwise occur such that, when the pump 410 has been stopped, an excess coating solution drips from the nozzle 250 on the wafer W at the second coating-procedure starting point and then the excess solution overflows to deforms the circle of coating film at the outer areas, like discussed in the known techniques. Even if an excess coating solution is supplied on the same area as discussed above, the final coating point for the nozzle 250 is positioned over the inner side of the coating film in this embodiment so that the excess coating solution on this inner side will be dispersed easily, compared to the outer areas, thus the outer circle of the coating film will hardly deformed.

Therefore, the first embodiment enhances uniformity of stress to be applied to a coating film in procedures that follow the coating procedures, and thus allows constant evaporation of solvent in a drying procedure under decreased pressure, to provide high uniformity of film thickness over the entire surface of a coating film.

(Second Embodiment)

Disclosed next is a second embodiment. The coating-film forming apparatus disclosed in the first embodiment can be used in the second embodiment. Thus, the apparatus for the second embodiment will not be explained and shown for brevity.

The difference between the first and the second embodiments lies in the second coating procedure. In the first embodiment, the nozzle 250 stops just before the start of the second coating procedure and the coating solution is sprayed while the wafer W is rotating. On the contrary, in the second embodiment, the nozzle 250 is continuously spraying the coating solution to form the outer shape of the coating film as close as possible to a circle.

In detail, in the second embodiment, the first coating procedure is performed, for example, the same as in the first embodiment. The procedure then goes to the second coating procedure when the head B1 of the line of coating solution has reached the outer edge of the circular area A to be coated, or the point at which the coating solution will overflow from the area C1 not coated yet if spiral spraying continues as indicated by a dashed line in FIG. 10A. In other words, the first coating procedure is completed when the head B1 of the line of coating solution has reached the outer edge of the circle area A to be coated.

The second coating procedure in the second embodiment is explained in detail with reference to FIG. 10B in which the line of coating solution is indicated as thicker than that in FIG. 10A.

On completion of the first coating procedure, the nozzle 250 travels outwards at a speed slower than before so that a center point D1 of the line of coating solution will be is shifted to a point D2 at the edge of the area A to be coated in FIG. 10B. The distance between the points D1 and D2 is half the width of coating solution. Under assumption that the width of coating solution is always constant on the entire surface of the wafer W, the line of coating solution is shifted outwards by one line width while the wafer W is rotating by 360 degrees, thus the amount of shifting being ½. The speed of the nozzle 250 in the second coating procedure is then ½ of that in the first coating procedure if the latter is constant.

The spraying rate for the coating solution is adjusted as gradually becoming lower so that it will become zero when the nozzle 250 reaches the point D2. In other words, it is controlled so that the coating film will have a uniform thickness on the entire surface of the wafer W when the coating procedures are completed.

The nozzle 250 is controlled as explained above so that it will spray the coating solution while passing the center L1 of the area C1 not coated yet, in FIG. 10B. In addition, the spraying rate for the coating solution is adjusted so that it will match the width of the area C1 not coated yet.

Therefore, the second coating procedure in the second embodiment offers almost a circular outer areas to the coating film formed on the wafer W.

As disclosed above, the second embodiment achieves the formation of circular coating film that almost matches the shape of the area A to be coated. A significant section as discussed in the known technique (1) will thus not be formed or be smaller than that in the known technique (1). Moreover, there will be few sections of the wafer W on which the coating solution is sprayed more than one time, thus resulting in a little difference in film thickness between the center and the outer areas of the coating film for enhanced uniformity in film thickness over the entire surface of the coating film.

Disclosed so far in the second embodiment is that the spraying rate for the coating solution is adjusted as gradually becoming lower for narrower width of the line of coating solution to be sprayed on the wafer W. Not only that, wafer rotating speed may be controlled to increase peripheral velocity of the wafer W located just under the nozzle 250 for narrower width of the line of coating solution. Or, the spraying rate for the coating solution may be decreased with gradual increase in peripheral velocity of the wafer W for narrower width of the line of coating solution.

Moreover, like the first embodiment, the nozzle 250 may stop on completion of the first coating procedure, followed by the second procedure with gradual decrease in spraying rate for the coating solution while the wafer W is rotating and/or increase in rotating speed of the wafer W.

The width of line of coating film on outer areas of the coating film will become gradually narrow in these methods, so that significant sections (areas) will hardly be formed. Thus, these methods offer an almost circular outer areas for the coating film.

Furthermore, like the first embodiment, the nozzle 250 may be shifted a little bit towards the center of the wafer W after being stopped just before the completion of the second coating procedure to avoid dripping of coating solution from the nozzle 250 after stoppage of the supply of coating solution.

Such control of the nozzle 250 avoids deformation of the outer circular areas of the coating film even if the spraying rate for the coating solution does not become zero at the final coating point on the wafer W or the coating solution is dripped from the nozzle 250 at the final coating point, because the excess coating solution will be easily dispersed on the inner part of the coating film.

(Third Embodiment)

Third embodiment solves the problem of over-supplying of coating solution particular areas of the wafer due to dripping of the solution as discussed above in a way different from the first and the second embodiments.

Figure 11:
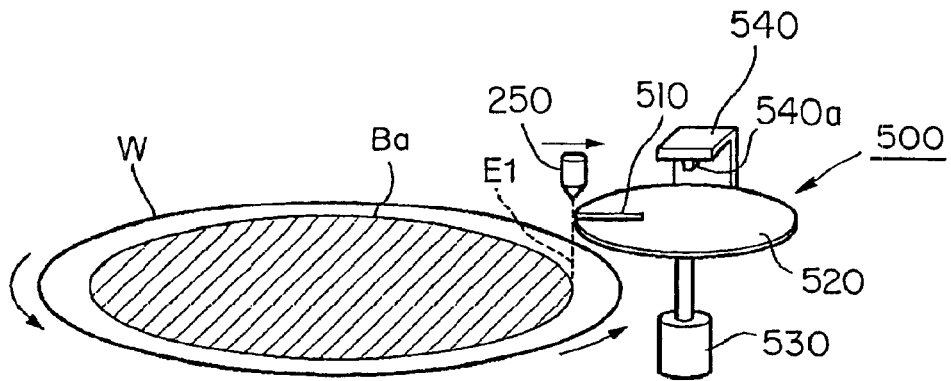
FIG. 11 is a perspective view showing a third embodiment according to the present invention.

This embodiment includes a solution-receiving mechanism 500, installed in the coating-film forming apparatus (FIG. 6), set as close to the wafer W held by the wafer holder 220, as shown in FIG. 11.

The solution-receiving mechanism 500 consists of a circular plate 520 for receiving a coating solution, having a slit 510 from the outer edge towards the center; a rotator 530 for supporting the plate 520 at the lower center surface of the plate while rotating about the vertical axis; and a cleaner 540 set along the rotator 530, having a nozzle 540*a* for spraying a cleaning liquid on the plate 520.

The slit 510 is formed on the plate 520 from the edge to cover a travelling range of the nozzle 250. The cleaner 540 has an opening (not shown) for sucking coating-solution components resolved into the cleaning liquid during cleaning.

The solution-receiving mechanism 500 may be used in the first and the second embodiments.

In operation, the nozzle 250 travels over the wafer W from the center the outer areas, while the wafer W is rotating, to form a coating film Ba, as illustrated in FIG. 11. The plate 520 has been positioned so that the slit 510 will be located just under the track of travelling nozzle 250. A flow E1 of the coating solution then flows into the slit 510 while the nozzle 250 is travelling over the wafer W.

Figure 12A:
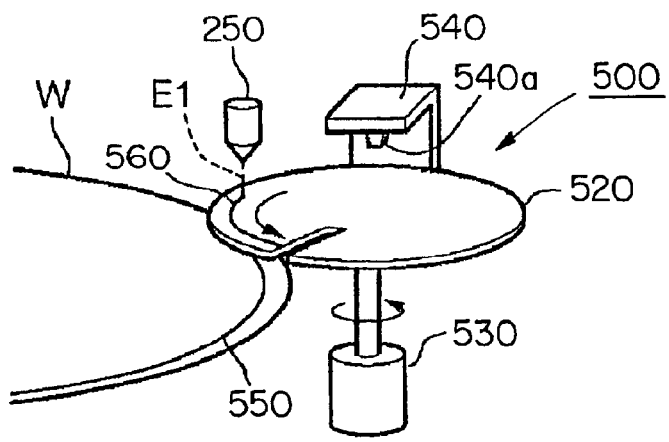
FIG. 12A illustrates an operation of the third embodiment according to the present invention.

Next, as shown in FIG. 12A, the rotator 530 is driven to rotate the plate 520 when a line 550 of coating solution has reached a final coating point (not shown) on the wafer W. The nozzle 250 has already traveled over the slit 510 when the plate 520 starts to rotate, so that the flow E1 of the coating solution is shut out on the plate 520 where no silt is formed. A coating solution 560 that should follow the line 550 of coating solution is therefore sprayed on the plate 520.

The main controller (FIG. 6) has sent a solution-supply halt command to the nozzle 250 before and after the rotation of the plate 520. The spraying of coating solution is therefore completely brought to a halt after the plate 520 has been rotated.

Figure 12B:
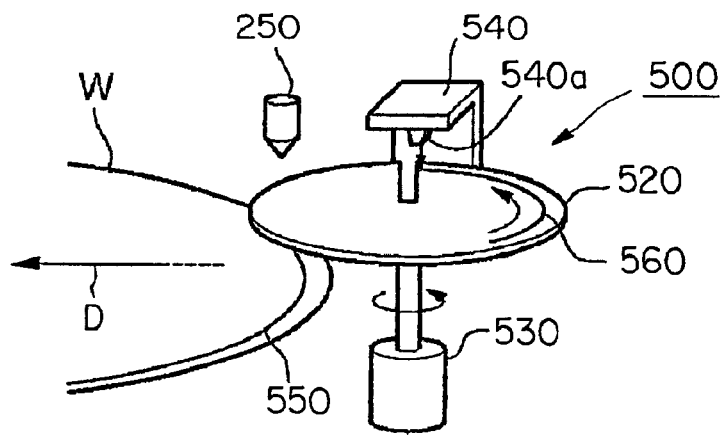
FIG. 12B also illustrates an operation of the third embodiment according to the present invention.

The wafer W is then taken out from the coating-solution forming apparatus, as indicated by an arrow D in FIG. 12B. The plate 520 is rotated further to transfer the coating solution 560 under the cleaner 540. The coating solution 560 is cleaned away with a solvent such as thinner supplied from the cleaner 540. Any liquid such as the coating solution dripped from the plate 520 is sucked by a sucking means (not shown). The plate 520 is rotated further to return the slit 510 to the original position as shown in FIG. 11 for the coating procedure to the subsequent wafer W.

According to the third embodiment, a flow of coating solution from the nozzle 250 is shut out on the plate 520. This mechanism accurately stops the supply of coating solution at the final coating point on the wafer W for the coating procedure even if the spraying of coating solution does not halt quickly due to the usage of a fine nozzle of about 100 m diameter.

Therefore, the generation of significant sections (areas) due to the supply of an excess coating solution on particular areas will hardly occur, so that the outer areas of coating film becomes closer to a circle. The embodiment thus achieves uniformity of stress to be applied to the coating film during procedures such as drying under decreased pressure, like the first and the second embodiments.

Moreover, the solution-receiving mechanism 500 has the plate 520 rotatable about the vertical axis and cleaner 540 for cleaning away the coating solution sprayed on the plate 520 while rotating. This arrangement achieves sequential operations, such as coating-solution cleaning and resetting to the original position for coating the subsequent wafer W, within a small space in the coating-solution forming apparatus.

The third embodiment can be combined with the first or the second embodiment.

(Fourth Embodiment)

Figure 14:
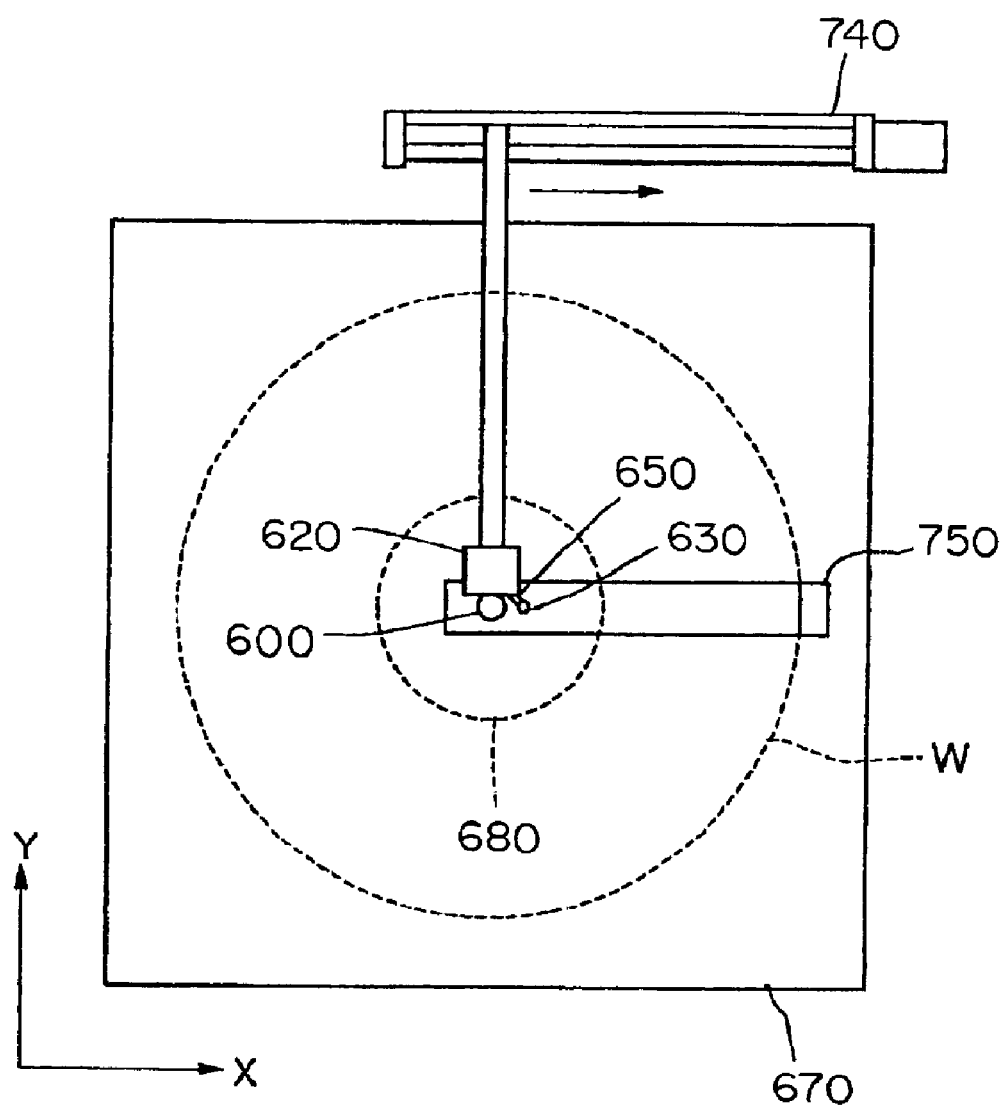
FIG. 14 is a plan view showing the fourth embodiment according to the present invention.

Disclosed next with reference to FIGS. 13 to 15 is a fourth embodiment of coating-solution forming apparatus incorporated into each coating unit 31 (FIG. 4).

Contained in the coating unit 31 is a case 670, a hollow housing with an opening (not shown) at either side for receiving and transferring wafers W.

Installed in the case 670 are a wafer holder 680 for holding each wafer W by sucking its rear surface and a rotary Mechanism 690 for sustaining the wafer holder 680 and rotating it about the vertical axis during a coating procedure. A slit 50 is formed at a ceiling edge of the case 670, which extends in the X-direction.

Provided over the case 670 is a coating nozzle 600 for splaying a polyimide solution (a coating solution) on the wafer W. The nozzle 600 is set so that its spray opening 610 will be inserted into the case 670 through the silt 750. The nozzle 600 is moved in the X-direction by a drive mechanism 740, while supported by a nozzle supporter 620, for spraying a coating solution through the spray opening 610, a very fine opening of about 100 $\mu$m diameter. The nozzle 600 can spray the coating solution at 0.05 milliliters/sec on the wafer W from 10 mm above, for example.

Attached to the nozzle supporter 620 is a fog nozzle 630 provided as adjacent to the nozzle 600 via a supporter 650. The fog nozzle 630 has a spray opening of about 0.5 mm diameter to spray a solvent for the coating solution at 0.025 milliliters/sec on the wafer w from 3 mm above, for example.

The coating nozzle 600 and the fog nozzle 630 are arranged, as illustrated in FIG. 15, such that the fog nozzle 630 sprays the solvent on the wafer W in advance on the areas on which the coating solution will be sprayed later by the coating nozzle.

The nozzle 600 is connected to a flexible solution-supply pipe 640 and further to a solution container 720 via a valve V10, a mixer 700 and a valve V20. The solution container 720 contains, for example, polyimide, a component of a coating film. The nozzle 600 is further connected to a solvent container 710 via a valve V30 connected to the mixer 700. The solvent container 710 contains, for example, thinner, a solvent for the coating solution.

The mixer 700 mixes the component of the coating film and the solvent to prepare the coating solution. The coating solution may, however, be prepared in the solution-supply pipe 640 without the mixer 700.

The fog nozzle 630 is connected to a flexible solvent-supply pipe 660 and further to the solvent container 710 via a valve V40.

The valves V10 to V40 (a flow-rate adjuster) are controlled by a controller 730 for their openings to adjust the amounts of the component of the coating film and the solvent to be supplied to the mixer 700 from the containers 710 and 720. The valve control also adjusts flow amounts of the coating solution and the solvent sprayed by the nozzles 600 and 630, respectively.

In operation, as shown in FIG. 4, when a cassette C is brought into the cassette station 21, a wafer W is picked up by the transfer arm 23. The wafer W is transferred by the transfer arm 23 to the transfer mechanism 25 via the transfer unit 35 of the shelf unit U2 shown in FIG. 5. The transfer mechanism 25 transfers the wafer W into the one of the coating units 31.

The wafer W transferred into the coating unit 31 is held almost horizontally while its rear surface is being sucked by the wafer holder 780, as shown in FIG. 13.

The valves V20 and V30 are opened at specific degrees to supply specific amounts of the component of the coating solution and the solvent to the miser 700 for preparing the coating solution at a specific density.

While the wafer W is rotating at a specific speed, the coating nozzle 600 is positioned just above the center of the wafer W. The valve V10 is opened to start spraying of the coating solution from the nozzle 600 which then gradually travels over the rotating wafer W from the center to the outer areas. The nozzle movement over the rotating wafer W forms a coating film on the wafer while the coating solution is being spirally sprayed thereon.

Figure 17:
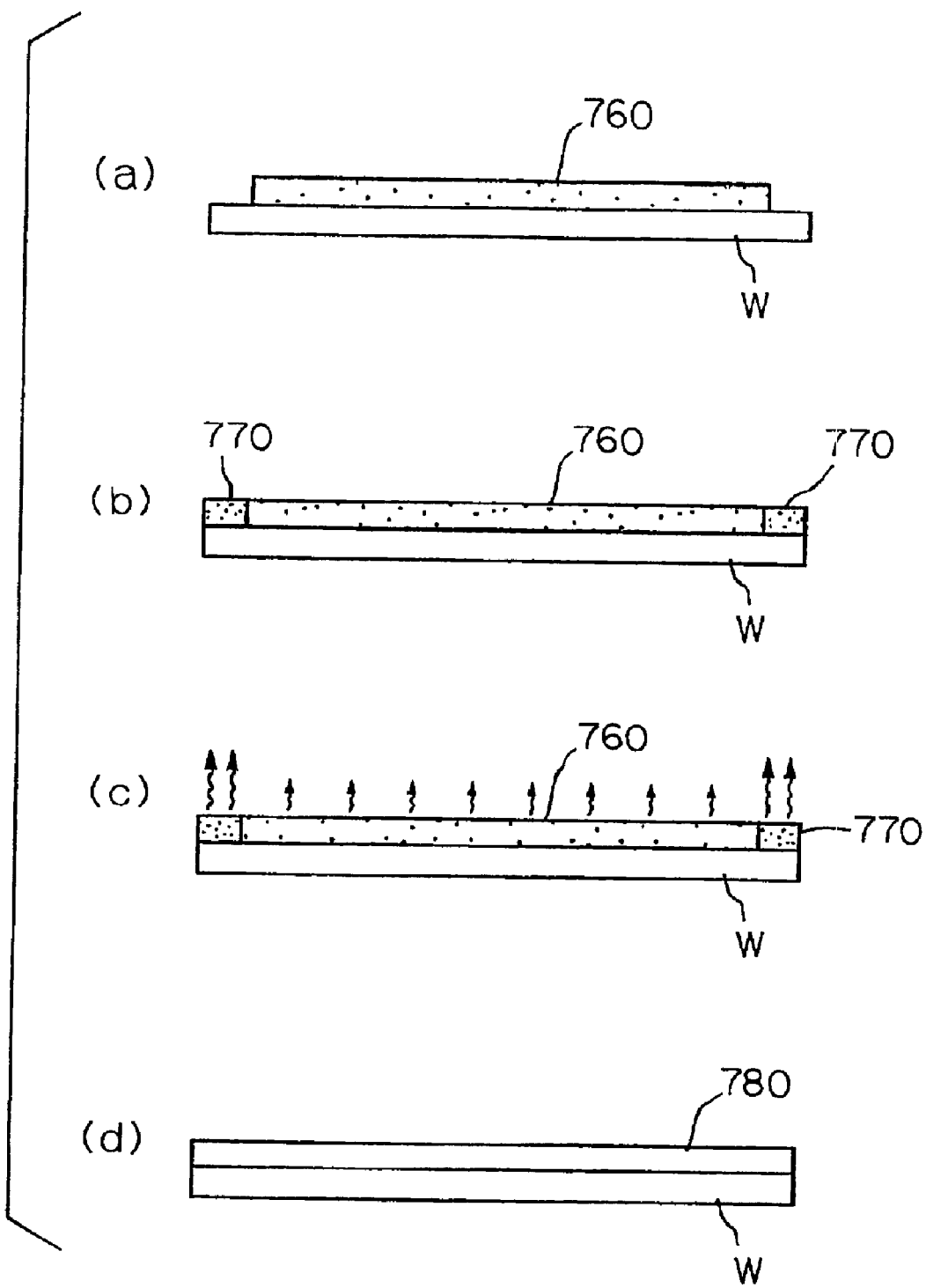
FIG. 17 illustrates sequential procedures of the fourth embodiment according to the present invention.

In detail, as illustrated in FIGS. 16 and 17(a), the coating nozzle 600 sprays the coating solution at a specific rate while it is travelling over the wafer W from the center to a first position that is about 3 mm to 5 mm inside the outer edges to form a coating film on a first area 760 of the wafer W.

Next, as illustrated in FIGS. 16 and 17(b), while the coating nozzle 600 is continuously spraying the coating solution at the specific rate, the valve V40 is opened to spray the solvent at a specific rate from the fog nozzle 630 travelling over the rotating wafer W to the outer areas with the coating nozzle 600 to form a coating film on a second area 770 outside the first area 760.

The amount of evaporating solvent from the second area 770 and the outer side edges of the wafer W will be larger than that from the first area 760, thus causing a high evaporating rate on the second area 770.

Difference in evaporating rate causes variation in film thickness. In detail, the evaporation of solvent from an area at a high evaporating rate causes decrease in temperature and thus increase in surface tension on this area. The increased surface tension pulls the coating solution towards the outer areas, which results in a thick polyimide film formed at the outer areas due to a high polyimide solidification rate.

In order to avoid such a phenomenon, the solvent is sprayed on the second area 770 at a temperature, 2 or 3 degrees higher than that for the coating solution.

Through these coating procedures, as illustrated in FIG. 18, a coating solution 790 is sprayed on the second area 770 of the wafer W from the coating nozzle 600 in a way that a solution 800 is sprayed from the fog nozzle 630 in advance on the areas on which the coating solution 790 will be sprayed later.

These coating procedures result in that the solvent is thicker on the second area 770 than the first area 760 from the center to the first position but inside the second area, in FIG. 16.

Each wafer W sprayed the coating solution thereon is transferred to the drying unit 32 under reduced pressure as the first drying means by the main transfer mechanism 25. The wafer W is heated at 50° C., for example, under reduced pressure of, for example, 13.3 Pa, for evaporation of the solvent involved in the coating solution, as illustrated in FIG. 17(c).

The wafer W is then transferred by the main transfer mechanism 25 to the heating unit 33 as the second drying means and heated at 90° C., for example, for prebaking to further solvent evaporation.

The wafer is transferred further by the main transfer mechanism 25 to the cooling unit 34 and cooled down to 23° C., for example, for formation of a coating film made of a polyimide film 780, as illustrated in FIG. 17(d).

The cooled wafer W is put back to the cassette C on the cassette station 22 by the main transfer mechanism 25.

According to the fourth embodiment, a coating solution is sprayed on the second area that is the outer area of the wafer W such that a solvent is sprayed in advance on the areas on which the coating solution will be sprayed later. This results in a large amount of solvent being applied on the second area compared to the first area, thus achieving uniformity of coating film thickness over the wafer surface. This is because, as already discussed, the amount of heat radiation will be higher on the outer areas than the other areas of the wafer W, and, depending on the amount of heat radiation, the solvent evaporation rate and hence the amount of solvent evaporation from the outer areas will also be higher.

As disclosed, the fourth embodiment offers the solution adjustments such that the coating solution is diluted with the solvent the amount of which is larger on the second area than the first area. This solution adjustments achieve almost the same degree of solvent evaporation over the first and the second areas, even if the solvent evaporates from the second area more than the first area.

Almost the same degree of solvent evaporation over the wafer surface as discussed above leads the polyimide solidification rate to be almost the same over the wafer surface, thus forming an almost uniform thickness of polyimide film over the wafer surface.

The optimum requirements such as the location of the first position (FIG. 6) and the amount of solvent to be sprayed from the fog nozzle 630 are decided by try and error with observation of bumps on the outer areas of polyimide coating films formed on samples wafers under several requirements variations.

The followings are recommended requirements, particularly, for formation of about 10 μm-thick polyimide film on 8-inch wafers:

The first position on wafer is preferably in the range from 3 mm to 5 mm from the outer edges. The amount of thinner (solvent) to be sprayed on the second area from the fog nozzle 630 is preferably in the range from 0.05 to 0.055 milliliters/sec while the fog nozzle is travelling at 1.0 to 1.2 mm/sec over a wafer rotating at a speed of 15 rpm.

An experiment was carried out as follows for the recommended requirements, using the coating-film forming apparatus shown in FIG. 13 installed in the coating unit 31.

About 10 μm-thick polyimide films were formed on sample 8-inch wafers under the requirements: 15 rpm in wafer rotation speed; 1.0 to 1.2 mm/sec in speed of the nozzles 600 and 630; 3 mm inside from wafer edge for the first position; and 0.05 milliliters/sec in mount of thinner (solvent) to be sprayed on the second area from the fog nozzle 630.

Measurement of film thickness over the wafer surface on each sample with film-thickness measuring equipment (nano-specification M5100) revealed high film-thickness uniformity with almost no bumps formed on the outer areas of the coating film.

In the fourth embodiment, it is also preferable that the coating solution and the solvent are sprayed on the second area while the coating nozzle 600 and the fog nozzle 630 are travelling over the wafer W towards the outer areas and then the fog nozzle 630 stops over the outer areas but is continuously spraying the solvent over the coating solution on the outer areas for about 4 or 5 seconds.

The wafer W is still rotating but the coating nozzle 600 halts spraying of the coating solution during the spraying of solvent on the outer areas. This spraying control supplies enough amount of solvent to the wafer outer edges on which a coating solution is supplied, thus achieving almost uniform evaporation rate for solvent over the wafer surface even if the amount of heat radiation is higher on the edges than the other areas. Therefore, this spraying control achieves high uniformity of polyimide film thickness over the entire wafer surface.

Moreover, in the fourth embodiment, the solvent is sprayed in advance on the areas on which the coating solution will be sprayed later. In other words, the coating solution will be sprayed on the areas on which the solvent has already been sprayed. The solvent sprayed in advance minimizes an angle of contact for the coating solution, so that the solution will be easily dispersed over the wafer surface to restrict unevenness of film thickness, or bumps on the outer areas.

The wafer rotation speed may be 5 to 10 rpm higher for spraying on the second area than the first area. Or, the speed of the coating nozzle 600 may be highered. Furthermore, the amount of solvent to be sprayed from the fog nozzle 603 may be smaller as illustrated in FIG. 19 compared to that in FIG. 18.

Figure 20:
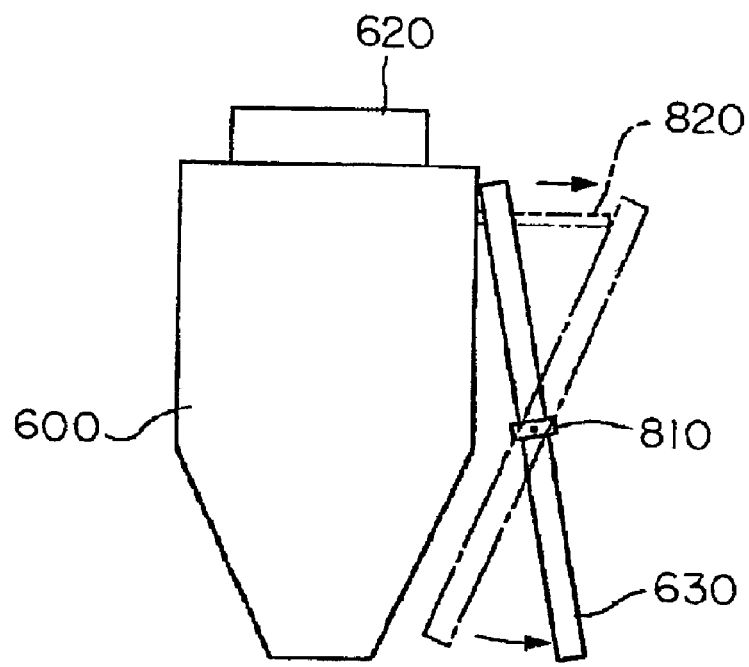
FIG. 20 is a front view illustrating a modification to the coating nozzle and the fog nozzle used in the fourth embodiment according to the present invention.
Figure 21:
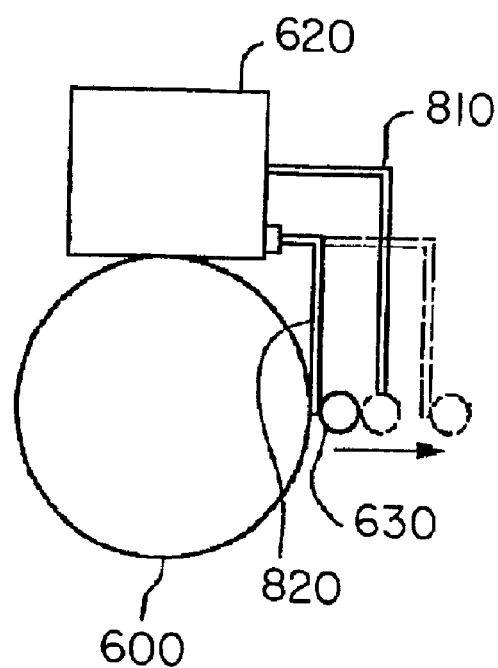
FIG. 21 is a plan view illustrating the modification to the coating nozzle and the fog nozzle used in the fourth embodiment according to the present invention.

Moreover, in this invention, the fog nozzle 630 may be installed as capable of swing at its tip (spray opening) within a given stroke about the horizontal axis, as illustrated in FIGS. 20 and 21.

In FIG. 20, the fog nozzle 630 is supported at the nozzle supporter 620 with a supporter 810 at its center in the longitudinal direction so that the nozzle 630 will be usually positioned at the coating nozzle (600) side at its upper section.

Installed in the nozzle supporter 620 is a pressuring unit mechanism 820, such as an air cylinder, that pushes the fog nozzle 630 at its section upper the supporter 810 from the coating nozzle (600) side so that the fog nozzle can swing at its tip (spray opening) within a given stroke or shift in a predetermined direction.

This mechanism allows the fog nozzle 630 to swing at any angle within the set range in relation to the coating nozzle 600 for adjustment to the area on which the solvent is to be sprayed before the coating solution.

The moving mechanism of the fog nozzle 630 achieves spraying of solvent over a wide area on which the coating solution will be sprayed later.

These spraying adjustments offer several types of solvent spraying in timing and area to be sprayed, etc., in accordance with a recipe for film coating.

It is preferable to spray the solvent in advance on the areas on which the coating solution will be sprayed later, in view of directly spraying thinner (solvent) on an area from which the thinner will be evaporated later. In addition, it is also preferable to spray the solvent and the coating solution on almost the same areas or spray the solvent later on the areas on which the coating solution has already been sprayed.

Moreover, the coating nozzle 600 and the fog nozzle 630 may be provided separately so that they can travel over the second area of the wafer W separately for spraying the coating solution and solvent. The fog nozzle 630 may be controlled so that it can stay over the outer areas to be coated with a coating film while spraying the solvent on the outer areas, so that much dense solvent will be supplied thereon. Or, using the mechanism shown in FIGS. 20 and 21, the fog nozzle 630 may be controlled so that it can swing while it stays over particular areas of the wafer W for wide area spraying.

The fog nozzle 630 is, however, not a must in this invention. In detail, the valve V30 provided along the coating-solution supplying route may be controlled by the controller 730 so that it will be more opened when the coating solution is being sprayed on the second area than the first area to supply a large amount of solvent to the mixer 700 From the solvent container 710 for spraying a large amount of solvent on the second area.

Moreover, in this invention, a mass flow controller may be installed as the flow-rate adjuster instead of the valves V10 to V40. Not only coating films of polyimide disclosed so far, the invention can be applied to formation of other types of coating film such as resist films exhibiting a high viscosity.

As disclosed, the present invention achieves uniformity of coating-film thickness over the entire wafer surface in forming a coating-film on a wafer by spirally spraying a coating solution thereon.

Moreover, the present invention achieves uniformity of coating-film thickness over the entire wafer surface with almost no bumps on outer areas of a wafer in forming a coating-film on the wafer by spirally spraying a coating solution thereon.

What is claimed is:

1. A coating-film forming apparatus comprising:
   a rotary mechanism configured to rotate a wafer while holding the wafer horizontally;
   a nozzle provided above the wafer and configured to travel over the wafer from a wafer center to a wafer outer area to spirally spray a coating solution on the wafer; and
   a controller configured to control the nozzle to stop when the coating solution has reached the wafer outer area, and to spray the coating solution in a circle on the wafer outer area while the wafer is rotating and to gradually decrease an amount of the coating solution sprayed to gradually narrow a width of the coating solution sprayed on the wafer as the coating solution approaches a final coating point on the wafer.

2. The coating-film forming apparatus according to claim 1, further comprising:

a solution receiver configured to be disposed between the nozzle and the wafer when the coating solution has reached the final coating point on the wafer to shut out an excess flow of the coating solution on the solution receiver.

3. The coating-film forming apparatus according to claim 2, wherein the solution receiver is configured to rotate about a vertical axis.

4. A coating-film forming apparatus comprising:

a rotary mechanism configured to rotate a wafer while holding the wafer horizontally;

a nozzle provided above the wafer and configured to travel over the wafer from a wafer center to a wafer outer area to spirally spray a coating solution on the wafer; and a controller configured to control the nozzle to stop when the coating solution has reached the wafer outer area, and to spray the coating solution in a circle on the wafer outer area while the wafer is rotating and to gradually increase a peripheral velocity of the wafer under the nozzle to gradually narrow a width of the coating solution sprayed on the wafer as the coating solution approaches a final coating point on the wafer.

5. The coating-film forming apparatus according to claim 4, further comprising:

a solution receiver configured to be disposed between the nozzle and the wafer when the coating solution has reached the final coating point on the wafer to shut out an excess flow of the coating solution on the solution receiver.

6. The coating-film forming apparatus according to claim 5, wherein the solution receiver is configured to rotate about a vertical axis.

7. A coating-film forming apparatus comprising:

a rotary mechanism configured to rotate a wafer while holding the wafer horizontally;

a nozzle provided above the wafer and configured to travel over the wafer from a wafer center to a wafer outer area to spirally spray a coating solution on the wafer; and a controller configured to control the nozzle to stop when the coating solution has reached the wafer outer area, and to spray the coating solution in a circle on the wafer outer area while the wafer is rotating and to gradually decrease an amount of the coating solution sprayed and to gradually increase a peripheral velocity of the wafer under the nozzle to gradually narrow a width of the coating solution sprayed on the wafer as the coating solution approaches a final coating point on the wafer.

8. The coating-film forming apparatus according to claim 7, further comprising:

a solution receiver configured to be disposed between the nozzle and the wafer when the coating solution has reached the final coating point on the wafer to shut out an excess flow of the coating solution on the solution receiver.

9. The coating-film forming apparatus according to claim 8, wherein the solution receiver is configured to rotate about a vertical axis.

* * * * *